United States Patent

Allman et al.

[11] Patent Number: 6,077,783
[45] Date of Patent: Jun. 20, 2000

[54] METHOD AND APPARATUS FOR DETECTING A POLISHING ENDPOINT BASED UPON HEAT CONDUCTED THROUGH A SEMICONDUCTOR WAFER

[75] Inventors: Derryl D. J. Allman, Colorado Springs; David W. Daniel, Divide, both of Colo.; Michael F. Chisholm, Garland, Tex.

[73] Assignee: LSI Logic Corporation, Milpitas, Calif.

[21] Appl. No.: 09/109,335

[22] Filed: Jun. 30, 1998

[51] Int. Cl.[7] .................................................. H01L 21/302
[52] U.S. Cl. .......................... 438/691; 438/692; 438/693; 451/288
[58] Field of Search .................................... 438/690, 691, 438/692, 693; 451/7, 285, 287, 288

[56] References Cited

U.S. PATENT DOCUMENTS

| | | | |
|---|---|---|---|
| 3,734,620 | 5/1973 | Cade | 356/73 |
| 3,748,014 | 7/1973 | Beiser | 350/6 |
| 4,312,732 | 1/1982 | Degenkolb et al. | 204/192 |
| 4,374,915 | 2/1983 | Ahlquist et al. | 430/22 |
| 4,632,724 | 12/1986 | Chesebro et al. | 156/626 |
| 4,689,491 | 8/1987 | Lindow et al. | 250/572 |
| 4,793,895 | 12/1988 | Kaanta et al. | 156/627 |
| 5,036,015 | 7/1991 | Sandhu et al. | 437/8 |
| 5,081,421 | 1/1992 | Miller et al. | 324/671 |
| 5,151,584 | 9/1992 | Ebbing et al. | 250/201.4 |
| 5,169,491 | 12/1992 | Doan | 156/636 |
| 5,196,353 | 3/1993 | Sandhu et al. | 437/8 |
| 5,222,329 | 6/1993 | Yu | 51/165.77 |
| 5,240,552 | 8/1993 | Yu et al. | 156/636 |
| 5,245,790 | 9/1993 | Jerbic | 51/121 |
| 5,245,794 | 9/1993 | Salugsugan | 51/165.74 |
| 5,258,093 | 11/1993 | Maniar | 156/626 |
| 5,265,378 | 11/1993 | Rostoker | 51/165.75 |
| 5,272,115 | 12/1993 | Sato | 437/228 |
| 5,308,438 | 5/1994 | Cote et al. | 156/636 |
| 5,310,455 | 5/1994 | Pasch et al. | 156/636 |
| 5,321,304 | 6/1994 | Rostoker | 257/621 |
| 5,337,015 | 8/1994 | Lustig et al. | 324/671 |
| 5,362,669 | 11/1994 | Boyd et al. | 437/67 |
| 5,385,866 | 1/1995 | Bartush | 437/186 |
| 5,389,194 | 2/1995 | Rostoker et al. | 156/636 |
| 5,399,234 | 3/1995 | Yu et al. | 156/636 |
| 5,403,228 | 4/1995 | Pasch | 451/256 |
| 5,405,806 | 4/1995 | Pfiester et al. | 437/200 |
| 5,439,551 | 8/1995 | Meikle et al. | 156/626.1 |
| 5,449,314 | 9/1995 | Meikle et al. | 451/41 |
| 5,483,568 | 1/1996 | Yano et al. | 378/44 |
| 5,492,594 | 2/1996 | Burke et al. | 216/86 |
| 5,516,400 | 5/1996 | Pasch et al. | 156/636.1 |
| 5,531,861 | 7/1996 | Yu et al. | 156/636.1 |
| 5,559,428 | 9/1996 | Li et al. | 324/71.5 |
| 5,561,541 | 10/1996 | Sharp et al. | 359/66 |
| 5,595,526 | 1/1997 | Yau et al. | 451/8 |
| 5,597,442 | 1/1997 | Chen et al. | 156/626.1 |
| 5,597,590 | 1/1997 | Tanimoto et al. | 425/174.4 |
| 5,607,341 | 3/1997 | Leach | 451/41 |
| 5,609,511 | 3/1997 | Moriyama et al. | 451/5 |
| 5,614,446 | 3/1997 | Ramaswami et al. | 437/228 |

(List continued on next page.)

*Primary Examiner*—Benjamin L. Utech
*Assistant Examiner*—Kin-Chan Chen

[57] ABSTRACT

A method of polishing a first layer of a semiconductor wafer down to a second layer of the semiconductor wafer is disclosed. One step of the method includes heating a back surface of the semiconductor wafer to a first temperature level so as to cause a front surface of the semiconductor wafer to have a second temperature level. Another step of the method includes polishing the semiconductor wafer whereby material of the first layer is removed from the semiconductor wafer. The polishing step causes the second temperature level of the front surface to change at a first rate as the material of the first layer is being removed. The method also includes the step of halting the polishing step in response to the second temperature level of the front surface changing at a second rate that is indicative of the second layer being polished during the polishing step. Polishing systems are also disclosed which detect a polishing endpoint for a semiconductor wafer based upon heat conducted through the semiconductor wafer.

10 Claims, 6 Drawing Sheets

U.S. PATENT DOCUMENTS

| | | | |
|---|---|---|---|
| 5,624,304 | 4/1997 | Pasch et al. | 451/287 |
| 5,626,715 | 5/1997 | Rostoker | 438/4 |
| 5,627,110 | 5/1997 | Lee et al. | 438/692 |
| 5,637,185 | 6/1997 | Muraka et al. | 438/5 |
| 5,639,388 | 6/1997 | Kimura et al. | 216/84 |
| 5,643,046 | 7/1997 | Katakabe et al. | 451/6 |
| 5,643,050 | 7/1997 | Chen | 451/10 |
| 5,643,061 | 7/1997 | Jackson et al. | 451/289 |
| 5,644,221 | 7/1997 | Li et al. | 324/71.5 |
| 5,645,682 | 7/1997 | Skrovan | 156/636.1 |
| 5,647,952 | 7/1997 | Chen | 156/636.1 |
| 5,656,229 | 8/1997 | Tanimoto et al. | 264/400 |
| 5,658,183 | 8/1997 | Sandhu et al. | 451/5 |
| 5,660,672 | 8/1997 | Li et al. | 156/345 |
| 5,663,101 | 9/1997 | Cronin | 438/637 |
| 5,663,797 | 9/1997 | Sandhu | 438/16 |
| 5,664,987 | 9/1997 | Rentein | 451/21 |
| 5,667,424 | 9/1997 | Pan | 451/6 |
| 5,667,433 | 9/1997 | Mallon | 451/287 |
| 5,667,629 | 9/1997 | Pan et al. | 438/13 |
| 5,668,063 | 9/1997 | Fry et al. | 438/5 |
| 5,670,410 | 9/1997 | Pan | 437/60 |
| 5,672,091 | 9/1997 | Takahashi et al. | 451/6 |
| 5,674,784 | 10/1997 | Jang et al. | 437/195 |
| 5,681,215 | 10/1997 | Sherwood | 568/215 |
| 5,691,253 | 11/1997 | Kobayashi | 438/690 |
| 5,695,660 | 12/1997 | Litvak | 216/85 |
| 5,700,180 | 12/1997 | Sandhu et al. | 451/5 |
| 5,702,292 | 12/1997 | Brunelli et al. | 451/41 |
| 5,704,987 | 1/1998 | Huynh et al. | 134/6 |
| 5,705,320 | 1/1998 | Hsu et al. | 430/313 |
| 5,705,435 | 1/1998 | Chen | 438/8 |
| 5,710,076 | 1/1998 | Dai et al. | 438/305 |
| 5,712,185 | 1/1998 | Tsai et al. | 437/67 |
| 5,716,873 | 2/1998 | Prall et al. | 437/228 |
| 5,720,845 | 2/1998 | Liu | 156/345 |
| 5,722,875 | 3/1998 | Iwashita et al. | 451/8 |
| 5,722,877 | 3/1998 | Meyer et al. | 451/41 |
| 5,725,417 | 3/1998 | Robinson | 451/56 |
| 5,736,462 | 4/1998 | Takahashi et al. | 438/692 |
| 5,738,567 | 4/1998 | Manzonie et al. | 451/41 |
| 5,741,171 | 4/1998 | Sarfaty et al. | 451/6 |
| 5,747,380 | 5/1998 | Yu et al. | 438/599 |
| 5,755,614 | 5/1998 | Adams et al. | 451/60 |
| 5,762,536 | 6/1998 | Pant et al. | 451/6 |
| 5,762,537 | 6/1998 | Sandhu et al. | 451/7 |
| 5,777,739 | 7/1998 | Sandhu et al. | 356/357 |
| 5,795,495 | 8/1998 | Meikle | 216/88 |
| 5,861,055 | 1/1999 | Allman et al. | 106/3 |
| 5,865,666 | 2/1999 | Nagahara | 451/10 |
| 5,868,608 | 2/1999 | Allman et al. | 451/72 |
| 5,882,244 | 3/1999 | Hiyama et al. | 451/7 |
| 5,882,251 | 3/1999 | Berman et al. | 451/527 |
| 5,888,120 | 3/1999 | Doran | 451/41 |
| 5,893,756 | 4/1999 | Berman et al. | 438/692 |
| 5,931,719 | 8/1999 | Nagahara et al. | 451/41 |
| 5,948,697 | 9/1999 | Hata | 438/690 |
| 5,957,757 | 9/1999 | Berman | 451/56 |

METHOD AND APPARATUS FOR DETECTING A POLISHING ENDPOINT BASED UPON HEAT CONDUCTED THROUGH A SEMICONDUCTOR WAFER

BACKGROUND OF THE INVENTION

The present invention relates generally to an endpoint detection method and apparatus, and more particularly to a method and apparatus that detect a polishing endpoint for a semiconductor wafer based upon heat conducted through the semiconductor wafer.

Semiconductor integrated circuits are typically fabricated by a layering process in which several layers of material are fabricated (i) on or in a surface of a wafer, or (ii) on a surface of a previous layer. This fabrication process very often requires layers to be fabricated upon a smooth, planar surface of a previous layer. However, the surface topography of layers may be highly uneven due to (i) areas which are higher than the remainder of the surface or (ii) an uneven topography of an underlying layer. As a result, a layer may need to be polished so as to present a smooth planar surface for the next processing step, such as formation of a conductor layer or pattern on this surface.

In general, a semiconductor wafer may be polished to remove high topography and surface defects such as scratches, roughness, or embedded particles of dirt or dust. The polishing process typically is accomplished with a polishing system that includes top and bottom platens (e.g. a polishing platen and a wafer carrier), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate (i) higher removal rates, and (ii) selective removal of materials fabricated upon the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in potential scrapping of the semiconductor wafer due to either (i) removing portions of an integrated circuit implemented by the semiconductor wafer or (ii) shorting circuit elements implemented by the semiconductor wafer. Since many processing steps have occurred prior to the polishing process, scrapping a semiconductor wafer during fabrication results in a significant financial loss. Underpolishing (removing too little) results in poor surface planarity which leads to electrical shorts at subsequent circuit wiring fabrication steps if post planarization measurements do not detect that the semiconductor wafer has been underpolished. On the other hand, if post planarization measurements do detect that the semiconductor wafer has been underpolished, then production costs for the semiconductor wafer rise due to costs associated with further polishing the semiconductor wafer after post planarization measurements.

Traditionally, lasers and other optical detection devices have been employed to determine polishing endpoints. However, such optical systems are difficult to implement in polishing systems, because in such machines the wafers are polished face down against a moving (e.g. rotating) polishing platen. More particularly, the wafer is hidden under the top platen thereby making optical endpoint detection difficult.

A typical method employed for determining endpoint in polishing systems is to measure the amount of time needed to planarize a first wafer, and then to run the remaining wafers for similar times. In practice this method is extremely time consuming, since operators must measure each wafer after polishing. This is because it is extremely difficult to precisely control the removal rate of material from a semiconductor wafer since (i) polishing consumables dynamically change (wear and/or heat) during the polishing process, and (ii) variance between characteristics of different semiconductor wafers such as starting film thickness, wafer bow, film stress, surface topography, and topography.

Thus, a continuing need exists for a method and an apparatus which accurately and efficiently detects the endpoint of a polishing process.

SUMMARY OF THE INVENTION

In accordance with one embodiment of the present invention, there is provided a method of polishing a first layer of a semiconductor wafer down to a second layer of the semiconductor wafer. One step of the method includes heating a back surface of the semiconductor wafer to a first temperature level so as to cause a front surface of the semiconductor wafer to have a second temperature level. Another step of the method includes polishing the semiconductor wafer whereby material of the first layer is removed from the semiconductor wafer. The polishing step causes the second temperature level of the front surface to change at a first rate as the material of the first layer is being removed. The method also includes the step of halting the polishing step in response to the second temperature level of the front surface changing at a second rate that is indicative of the second layer being polished during the polishing step.

Pursuant to another embodiment of the present invention, there is provided an apparatus for monitoring a process of polishing a first layer of a semiconductor wafer down to a second layer of the semiconductor wafer. The apparatus includes a heating element, a sensor, and a controller. The heating element is operable to heat a back surface of the semiconductor wafer to a first temperature level during the process of polishing. The heating of the back surface to the first temperature level causes a front surface of the semiconductor wafer to have a second temperature level. The second temperature level changes at a first rate when the first layer is being polished during the process of polishing and at a second rate when the second layer is being polished during the process of polishing. The sensor is operable to generate a temperature signal indicative of the second temperature level of the front surface. The controller is operable to (i) receive the temperature signal, (ii) determine from the temperature signal that the second temperature level of the front surface is changing at the second rate, and (iii) cause the process of polishing to halt when the second temperature level of the front surface is determined to be changing at the second rate.

Pursuant to yet another embodiment of the present invention, there is provided an apparatus for polishing a first layer of a semiconductor wafer down to a second layer of the semiconductor wafer. The apparatus includes a polishing platen having a polishing surface, a wafer carrier, a heating element embedded in the wafer carrier, a sensor, and a controller. The wafer carrier is urged against a back surface of the semiconductor wafer so as to cause a front surface of the semiconductor wafer to be pressed against the polishing surface whereby a polishing process is performed in which material of the first layer is removed from the semiconductor wafer when relative movement occurs between the polishing surface and the wafer carrier. The heating element is configured to heat the back surface of the semiconductor wafer to a first temperature level. The heating of the back surface to the first temperature level causes the front surface of the semiconductor wafer to have a second temperature level. The second temperature level changes at a first rate when the first layer is being polished during the polishing process and at a second rate when the second layer is being polished during the polishing process. The sensor is operable to generate a temperature signal indicative of the second temperature level of the second surface. The controller is operable to (i) receive the temperature signal, (ii) determine from the temperature signal that the second temperature level of the second surface is changing at the second rate, and (iii) cause the polishing process to halt when the second temperature level of the second surface is determined to be changing at the second rate.

Pursuant to further embodiment of the present invention, there is provided a method of polishing a first layer of a semiconductor wafer down to a second layer of said semiconductor wafer. One step of the method includes heating said semiconductor wafer to a temperature level. Another step of the method includes polishing said semiconductor wafer during said heating step. Yet another step of the method includes detecting when a rate of change of said temperature level changes from a first predetermined rate to a second predetermined rate during said polishing step and generating a control signal in response thereto. The method also includes the step of halting said polishing step in response to generation of said control signal.

Pursuant to yet further embodiment of the present invention, there is provided a method of polishing a first layer of a semiconductor wafer down to a second layer of said semiconductor wafer. One step of the method includes heating said semiconductor wafer to a temperature level. Another step of the method includes polishing said semiconductor wafer during said heating step. The method also includes the step of determining a rate of change of said temperature level during said polishing step. Moreover, the method includes the step of halting said polishing step when said rate of change equals a predetermined rate of change value.

It is an object of the present invention to provide a new and useful method and apparatus for determining an endpoint of a polishing process.

It is an object of the present invention to provide an improved method and apparatus for determining an endpoint of a polishing process.

It is a also an object of the present invention to provide a method and apparatus which accurately and efficiently detect the endpoint of a polishing process.

It is a further object of the present invention to provide a method and apparatus for determining that a polishing system has polished a first layer of a semiconductor wafer down to a second layer of the semiconductor wafer.

It is yet another object of the present invention to provide a method and apparatus that detect a polishing endpoint for a semiconductor wafer without removing the semiconductor wafer from the polishing apparatus.

The above and other objects, features, and advantages of the present invention will become apparent from the following description and the attached drawings.

DETAILED DESCRIPTION OF A PREFERRED EMBODIMENT

Figure 1A:
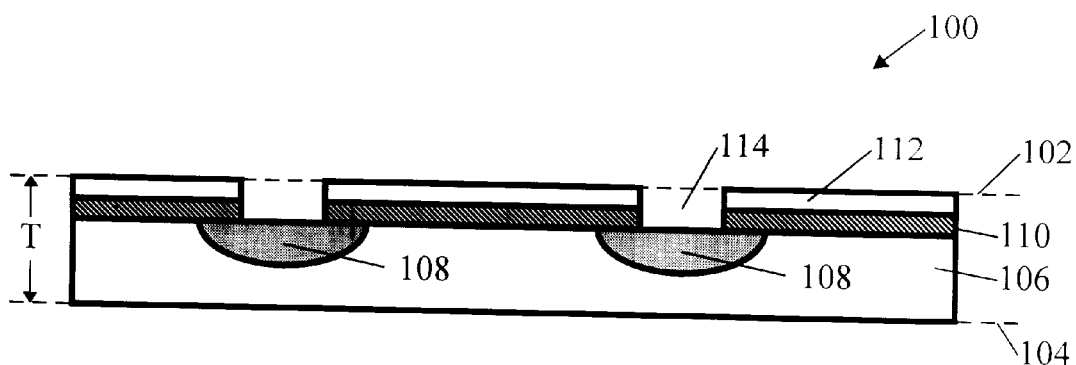
FIGS. 1A, 1B, and 1C show sectional views of a semiconductor wafer during various steps of fabrication.

While the invention is susceptible to various modifications and alternative forms, specific embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

Figure 1B:
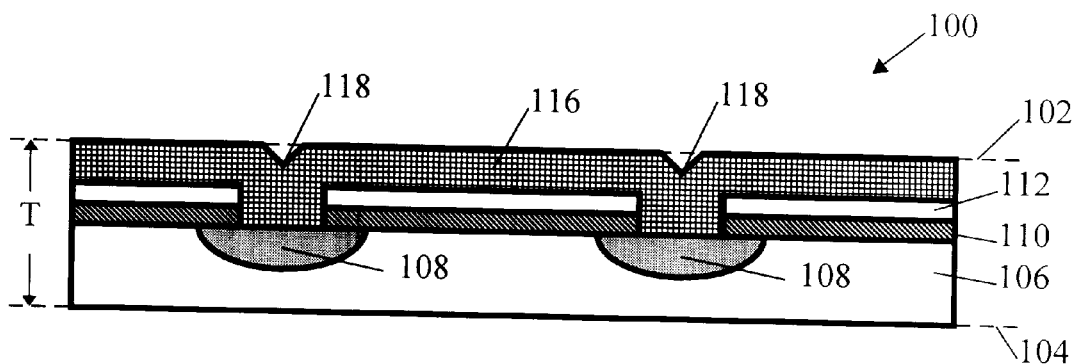
Figure 1C:
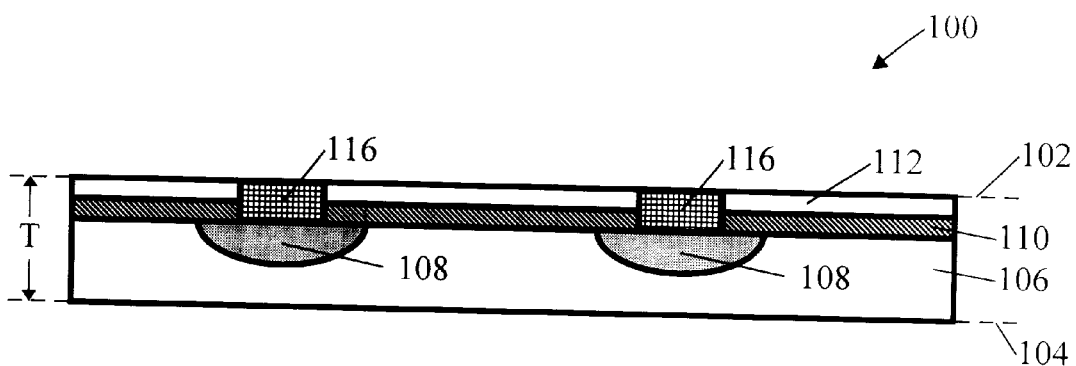

As stated above, a semiconductor wafer after various steps of a fabrication process needs to be planarized in order to remove topography from the surface of the semiconductor wafer. FIGS. 1A, 1B, and 1C illustrate sectional views of a semiconductor wafer 100 after various steps of a fabrication process of the present invention. In particular, FIGS. 1A, 1B, and 1C illustrate planarization of a semiconductor 100 down to a polishing endpoint layer 112.

FIG. 1A shows the semiconductor wafer 100 after a number of steps of a fabrication process. The semiconductor wafer 100 has a thickness T which is defined by the distance between a front surface 102 of the semiconductor wafer 100 and a back surface 104 of the semiconductor wafer 100. As shown, the semiconductor wafer 100 includes a semiconductor substrate 106 into which the fabrication formed doped areas 108. Furthermore, the fabrication process formed an insulating layer 110 upon the semiconductor substrate 106, and the polishing endpoint layer 112 upon the insulating layer 110. Moreover, the fabrication process etched contact holes 114 through the polishing endpoint layer 112 and the insulating layer 110 at locations above the doped areas 108.

The semiconductor wafer 100 is shown in FIG. 1B after the fabrication process formed a metal layer 116 such as tungsten over the polishing endpoint layer 112 and the contact holes 114. As a result, the metal layer 116 fills the contact holes 114 forming electrical contacts with the doped areas 108 of the semiconductor substrate 106. Moreover, the filling of the contact holes 114 forms pits 118 in the portion of the metal layer 116 lying above the contact holes 114.

FIG. 1C shows the semiconductor wafer 100 after a polishing system has polished the semiconductor wafer 100 down to the polishing endpoint layer 112. As depicted, the semiconductor wafer 100 has a planar front surface 102 upon which the fabrication process may fabricate additional layers.

Figure 2:
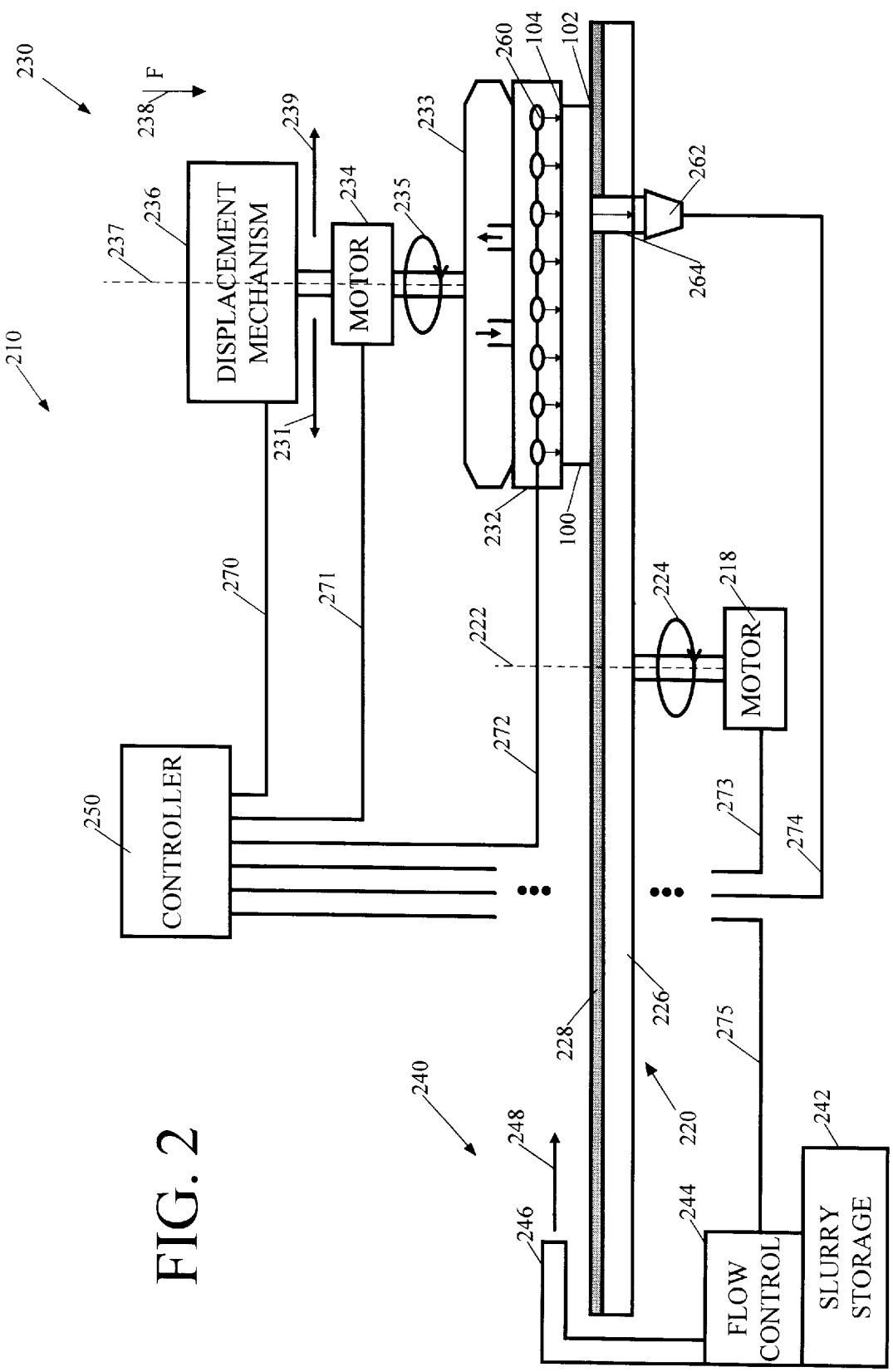
FIG. 2 shows a first embodiment of a polishing system which incorporates various features of the present invention therein.

Referring now to FIG. 2, there is shown a preferred embodiment of a polishing system 210 which planarizes the front surface 102 of a semiconductor wafer 100 down to the polishing endpoint layer 112. To this end, the polishing system 210 includes a platen motor or other drive mechanism 218 and platen subassembly 220. The platen motor 218 rotates the platen subassembly 220 about a center axis 222 at a platen velocity $V_P$. The platen motor 218 may rotate the platen subassembly 220 in a clockwise direction as shown by arrow 224 or in the counterclockwise direction.

The platen subassembly 220 includes a polishing platen 226 and polishing pad 228 mounted upon the polishing platen 226. Both the polishing platen 226 and the polishing pad 228 are preferably circular and define a polishing surface against which the polishing system 210 may polish the semiconductor wafer 100. Moreover, the polishing pad 228 protects the polishing platen 226 from chemical slurry and other chemicals introduced during the polishing process.

The polishing system 210 also includes a polishing head subassembly 230. The polishing head subassembly 230 includes a wafer carrier 232, a cooling mechanism 233, a carrier motor or other drive mechanism 234, and a wafer carrier displacement mechanism 236. The cooling mechanism 233 is operable to cool the wafer carrier 232 in order to help maintain the wafer carrier 232 at a substantially constant temperature.

The wafer carrier 232 applies a controlled adjustable downward force F (as illustrated by arrow 238) to press semiconductor wafer 100 into polishing pad 228 to facilitate polishing of the front surface 102 of the semiconductor wafer 100. The carrier motor 234 rotates the wafer carrier 232 and the semiconductor wafer 100 about a center axis 237 at a wafer velocity $V_W$. The carrier motor 234 may rotate the wafer carrier 232 in a clockwise direction as shown by arrow 235 or in the counterclockwise direction. However, the carrier motor 234 preferably rotates the wafer carrier 232 in the same rotational direction as platen motor 218 rotates the platen subassembly 220 (although the carrier motor 234 may rotate the semiconductor wafer 100 in the rotational direction opposite the rotational direction of the platen subassembly 220 as desired).

The wafer carrier 232 also includes mechanisms (not shown) for holding the semiconductor wafer 100. For example, the wafer carrier 232 may include a vacuum-type mechanism which generates a vacuum force that draws the semiconductor wafer 100 against the wafer carrier 232. Once the semiconductor wafer 100 is positioned on the wafer carrier 232 and held in contact with the platen subassembly 220 for polishing, the vacuum force may be removed. In such an arrangement, the wafer carrier 232 may be designed with a friction surface or a carrier pad which engages the back surface 104 of the semiconductor wafer 100. Furthermore, the carrier pad and downward force F create a frictional force between the wafer carrier 232 and the semiconductor wafer 100 that effectively holds the semiconductor wafer 100 against the wafer carrier 232 and causes the semiconductor wafer 100 to rotate at the same velocity as the wafer carrier 232. Such wafer carriers and carrier pads are of conventional design and are commercially available.

Furthermore, the wafer carrier 232 includes embedded heating elements 260 that are operable to heat the back surface of the semiconductor wafer 100. Specifically, in a preferred embodiment, the heating elements 260 are operable to heat the back surface 104 of the semiconductor wafer 100 to a substantially constant temperature level.

The displacement mechanism 236 moves the wafer carrier 232 and the semiconductor wafer 100 under a controlled force F across the platen subassembly 220 as indicated by arrows 231 and 239. The semiconductor wafer 100 is moved at an adjustable rate and along a variable polishing path P. The polishing path P may be linear, sinusoidal, or a variety of other patterns. The wafer carrier displacement mechanism 236 is also capable of moving the semiconductor wafer 100 along a polishing path to a location beyond the edge of the polishing pad 228 so that the semiconductor wafer 100 "overhangs" the edge. This overhang arrangement permits the semiconductor wafer 100 to be moved partially on and partially off the polishing pad 228 to compensate for polishing irregularities caused by a relative velocity differential between the faster moving outer portions and the slower moving inner portions of the platen subassembly 220.

The polishing system 210 also includes a sensor 262 positioned to receive thermal energy from the front surface 102 of the semiconductor wafer 100 while the polishing system 210 polishes the semiconductor wafer 100. In one embodiment, the sensor 262 includes an infrared detector that is placed opposite a window or hole 264 in the polishing platen 226 and the polishing pad 228. The infrared detector of the sensor 262 is operable to (i) receive infrared signals from said front surface 102, and (ii) generate based on the received infrared signals a temperature signal that is indicative of the temperature level of the front surface 102. In another embodiment, the sensor 262 includes a thermocouple that is placed in the polishing platen 228 such that thermal energy from the front surface 102 heats the thermocouple. In response to being heated by the front surface 102, the thermocouple generates a temperature signal that is indicative of the temperature level of the front surface 102.

The polishing system 210 also includes a slurry supply system 240. The slurry supply system 240 includes a slurry storage 242, a slurry flow control mechanism 244, and a slurry conduit 246. The slurry storage 242 includes one or more containers for storing slurry. In particular, the slurry storage 242 stores slurry that includes abrasive material which facilitates polishing of the front surface 102 of the semiconductor wafer 100. Furthermore, the slurry includes reactants which react with the material of the metal layer 116 to be removed at a higher reaction rate than the reactants react with the material of the polishing endpoint layer 112. Chemical slurries having such properties are well known and commercially available. It should be appreciated that due to the slurry reacting with the material of the metal layer 116 at a higher reaction rate than the slurry reacts with the material of the polishing endpoint layer 112, the polishing system 210 removes the material of the metal layer 116 at a faster polishing rate than the polishing system 210 removes the material of the polishing endpoint layer 112.

The slurry flow control mechanism 244 controls the flow of slurry through the slurry conduit 246, and the slurry conduit 246 transfers the slurry from the slurry storage 242 to the polishing area atop platen subassembly 220. To this end, the slurry flow control mechanism 244 and the slurry conduit 246 introduce slurry as indicated by arrow 248 atop the polishing pad 228 at a slurry flow rate $\Phi_s$.

The polishing system 210 further includes a controller 250 for controlling the polishing system 210 to effectuate the desired polishing results for the semiconductor wafer 100. The controller 250 is operatively coupled to the components of the polishing system 210 via connectors 270–275 to monitor and control in real-time the components of the polishing system 210. In particular, the controller 250 is configured to control the flow rate (s of the chemical slurry, the polishing path P, the wafer velocity $V_W$, and the platen velocity $V_P$. The controller 250 may be implemented with a microcontroller, an ASIC, discrete circuit components, or any combination of the above. Furthermore, the controller 250 may include computational means for calculating specific parameters and memory for storing software routines and parameters.

More specifically, the controller 250 is coupled to the displacement mechanism 236 via connector 270 to monitor and controllably adjust the polishing path P of the semiconductor wafer 100 and the speed at which the semiconductor wafer 100 is moved across the platen subassembly 220. The controller 250 is coupled to the carrier motor 234 via connector 271 to monitor the motor rpm and wafer velocity $V_W$ imparted by the wafer carrier 232 and to adjust the speed of the wafer carrier 232 as desired. The controller 250 is coupled to platen motor 218 via connector 273 to monitor the motor rpm and platen velocity $V_P$ of platen subassembly 220, and to adjust the speed of the platen subassembly 220 as desired. The controller 250 is coupled to the flow control mechanism 244 via a connector 275 to monitor and adjust the flow rate $\Phi_S$ of the chemical slurry. The controller 250 is also coupled to the heating elements 260 via a connector 272 and to the sensor 262 via connector 274.

In operation, the polishing system 210 polishes a front surface 102 of a semiconductor wafer 100 in order to planarize the front surface 102 of the semiconductor wafer 100. In particular, the polishing system 210 removes material from the front surface 102 until the polishing endpoint layer 112 is reached. To this end, the wafer carrier 232 engages the back surface 104 of a semiconductor wafer 100 and presses the front surface 102 of the semiconductor wafer 100 against the polishing pad 228 with a force F. The controller 250 causes (i) the platen motor 218 to rotate the platen subassembly 220 at a platen velocity $V_P$, (ii) the carrier motor 234 to rotate the wafer carrier 232 at a wafer velocity of $V_W$, (iii) the displacement mechanism 236 to execute a polishing path P, and (iv) the flow control mechanism 244 to apply chemical slurry to the polishing pad 228 at a flow rate of $\Phi_s$. The resulting complex movement of the wafer carrier 232 relative to the polishing pad 228, the force F, and the chemical slurry all cooperate to remove material from the front surface 102 of the semiconductor wafer 100 and to reduce the thickness T of the semiconductor wafer 100.

Furthermore, the controller 250 causes the heating elements 260 to heat the back surface 104 of the semiconductor wafer 100. The controller 250 monitors a temperature signal received from the sensor 262 that is representative of the temperature of the front surface 102 of the semiconductor wafer 100. From this temperature signal, the controller 250 determines whether the semiconductor wafer 100 has reached the polishing endpoint layer 112 and halts in response to the polishing process reaching the polishing endpoint layer 112.

Figure 3:
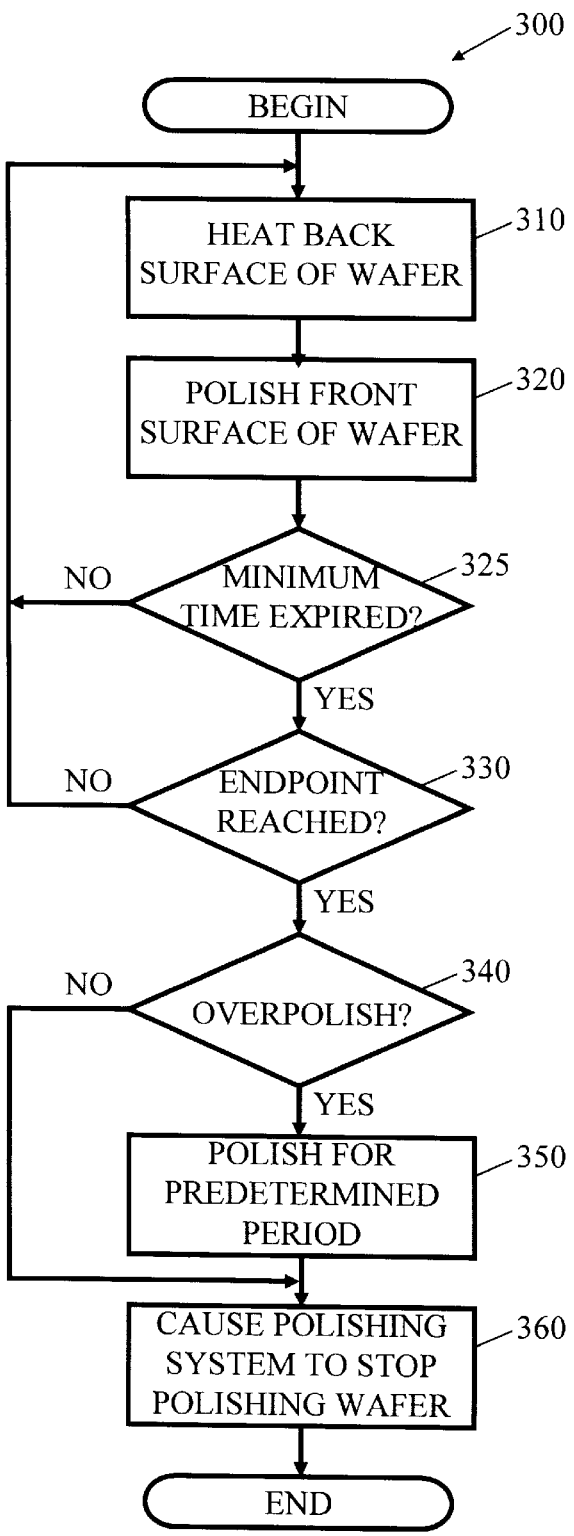
FIG. 3 shows a flowchart of a polishing procedure used by the polishing system of FIG. 2.

FIG. 3 illustrates a polishing procedure 300 utilized by the polishing system 210. The controller 250 in step 310 of the polishing procedure 300 causes the heating elements 260 to heat the back surface 104 of the semiconductor wafer 100 to a substantially constant first temperature level. Accordingly, the heating elements 260 cause heat to conduct from the back surface 104 through the semiconductor wafer 100 to the front surface 102. Due to the heat conducting through the semiconductor wafer 100, the front surface 102 exhibits a second temperature level that is dependant upon the first temperature level of the back surface 104 and the thickness T of the semiconductor wafer 100.

Then in step 320 the controller 250 causes the polishing system 210 to begin polishing the front surface 102 of the semiconductor wafer 100 in order to planarize the semiconductor wafer 100 and reduce the thickness T of the semiconductor wafer 100. In particular, the semiconductor wafer 100 functions as a thermal resistor which lessens the effect the heating elements 260 have on the second temperature level of the front surface 102. Due to the polishing system 210 removing material from the semiconductor wafer 100, the thermal resistance of the semiconductor wafer 100 decreases as the polishing system 210 decreases the thickness T of the semiconductor wafer 100. The polishing system 210 generally removes material from the front surface 102 of the semiconductor wafer 100 at a substantially linear polishing rate. As a result, the thermal resistance of the semiconductor wafer 100 decreases at a substantially linear rate which cause the heat conducted from the back surface 104 to raise the second temperature level of the front surface 102 at a substantially linear rate.

Figure 4:
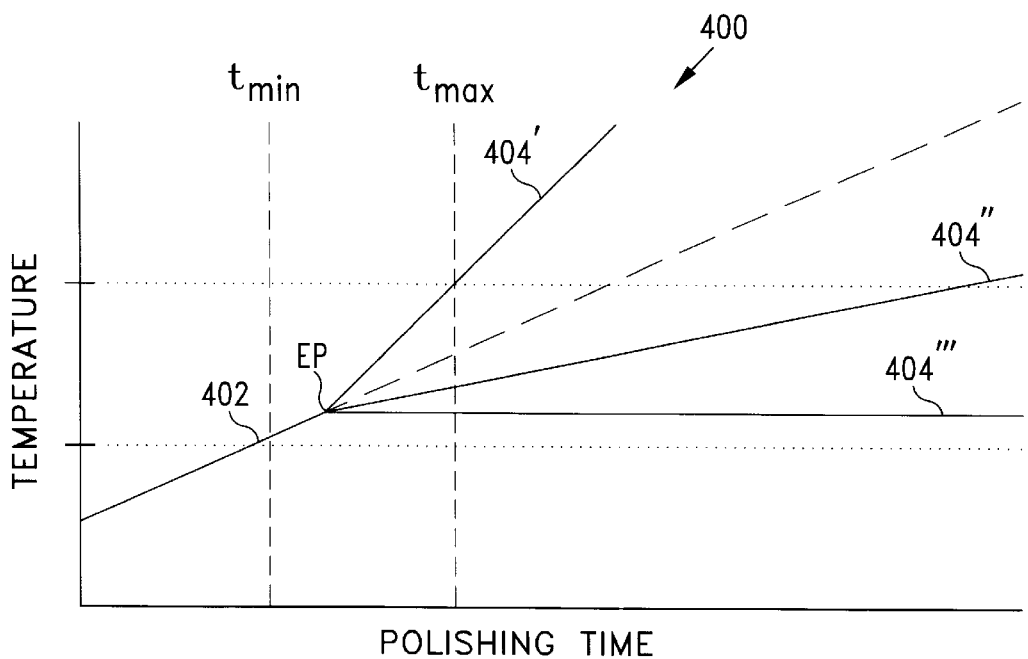
FIG. 4 shows a temperature response of a front surface of the semiconductor during the polishing procedure of FIG. 3.

The increase in the second temperature level as the polishing system 210 removes material from the semiconductor wafer 100 is illustrated in FIG. 4 by the portion 402 of the curve 400. As depicted in FIG. 4, the temperature level of the front surface 102 increases over time as the polishing system 210 decreases the thickness T of the semiconductor wafer 100.

In step 325, the controller 250 determines whether the polishing system 210 has polished the semiconductor wafer 100 for at least a predetermined minimum polishing time $t_{MIN}$. If the controller 250 determines that the polishing system 210 has not polished the semiconductor wafer 100 for the predetermined minimum polishing time $t_{MIN}$, then the controller returns to step 310 in order for the polishing system 210 to further remove material from the front surface 102 of the semiconductor wafer 100. The predetermined minimum polishing time $t_{MIN}$ is set to a time less than the time needed to polish the front surface 102 down to the polishing endpoint layer 112.

In step 330, the controller 250 determines whether the polishing system 210 has polished the front surface 102 down to the polishing endpoint layer 112. To this end, the controller 250 receives a temperature signal from the sensor 262 that is indicative of the second temperature level of the front surface 102 and determines from the temperature signal whether the polishing system 210 has reached the polishing endpoint layer 112. Since the polishing system 210 utilizes a chemical slurry that reacts with the material of the metal layer 116 at a higher reaction rate than the chemical slurry reacts with the material of the polishing endpoint layer 112, the polishing system 210 removes the material of the metal layer 116 at a higher polishing rate than the polishing system 210 removes the material of the polishing endpoint layer 112.

Accordingly, when the polishing system 210 reaches the polishing endpoint layer 112, the thermal resistance of the semiconductor wafer 100 decreases at a slower rate which causes the heat conducting from the back surface 104 to the front surface 102 to increase the second temperature level of the front surface 102 at a slower rate. The slower rate of change of the second temperature level is illustrated in FIG. 4 by the portion 404" of the curve 400. It should also be appreciated that once the polishing system 210 reaches the polishing endpoint layer 112 the second temperature level may also be effect by (i) a change in friction between the front surface 102 and the polishing pad 228, and (ii) the chemical slurry generating less thermal energy due to reacting less readily with the material of the polishing endpoint layer 112.

Since the second temperature level of the front surface 102 exhibits the characteristics shown in FIG. 4, the controller 250 may determine that the polishing system 210 has reached the polishing endpoint layer 112 by determining based upon the temperature signal produced by the sensor 262 that the rate of change of the second temperature level has changed. In particular, if the polishing system 210 is configured to remove the polishing endpoint layer 112 at a polishing rate substantially less than the polishing rate of the metal layer 116, the controller 250 may detect that the polishing system 210 has reached the polishing endpoint layer 210 by determining that the second temperature level has reached a substantially constant temperature (i.e. a rate of change substantially equal to zero) in relation to the temperature change experienced when polishing the metal layer 116. A substantially constant temperature level is illustrated in FIG. 4 with the portion 404''' of the curve 400.

Alternatively, the controller 250 may detect that the polishing system 210 has reached the polishing endpoint layer 112 by (i) determining that the second temperature level over time has changed by less a predetermined amount, (ii) determining that the rate of change of the second temperature level equals a predetermined rate of change value, or (iii) determining that the rate of change of the second temperature level changed from a first predetermined rate to a second predetermined rate.

Moreover, if the polishing system 210 is configured instead to remove the polishing endpoint layer 112 at a polishing rate that is faster than the polishing rate of the metal layer 116, the controller 250 may detect that the polishing system 210 has reached the polishing endpoint layer 210 by determining that the second temperature level is increasing at a faster rate than the rate experienced when polishing the metal layer 116. A faster rate of change in the second temperature level and the polishing rate is illustrated in FIG. 4 with the portion 404'' of the curve 400.

If the controller 250 determines in step 330 that the polishing system 210 has reached the polishing endpoint layer 112, then (i) the controller 250 generates a control signal which indicates the polishing system has reached the polishing endpoint layer 112, and (ii) the polishing system 210 proceeds to step 340 in response to generation of the control signal. Otherwise, the polishing system 210 returns to step 310 in order to remove more material from the semiconductor wafer 100 and reduce the thermal resistance of the semiconductor wafer 100.

In step 340, the controller 250 determines whether the polishing system 210 has been configured to overpolish the semiconductor wafer 100. After some fabrication processes it is desirable to polish the semiconductor wafer beyond the detected endpoint. Accordingly, if the controller 250 has determined that the polishing system has been configured to overpolish the semiconductor wafer 100, the polishing system 210 proceeds to step 350; otherwise the polishing system 210 proceeds to step 360.

In step 350, the controller 250 causes the polishing system 210 to further polish the front surface 102 of the semiconductor wafer 100 for a predetermined period of time. Once the predetermined period of time has elapsed, the controller proceeds to step 360.

The controller 250 in step 360 causes the polishing system 210 to stop polishing the semiconductor wafer 100. In particular, the controller 250 transmits control signals to the various components of the polishing system 210 which cause the polishing system 210 to cease removal of material from the front surface 104 of the semiconductor wafer 100.

It should be appreciated that by waiting until after the predetermined minimum polishing time before attempting to detect the polishing endpoint, the controller 250 more accurately detects when the polishing system 210 reaches the polishing endpoint layer 112. This is because the controller 250 ignores early fluctuations in the temperature signal that the controller 250 may otherwise incorrectly identify as being indicative of the polishing system 210 reaching the polishing endpoint layer 112. Furthermore, the temperature signal may be filtered using known analog or digital techniques in order to remove fluctuations that are not based on the polishing system 210 reaching the polishing endpoint layer 112.

In order to ensure that the semiconductor wafer 100 is not damaged due to the controller 250 failing to detect the polishing system 210 reaching the polishing endpoint layer 112, the controller 250 may also utilize a maximum polishing time $t_{MAX}$. In particular, the maximum polishing time $t_{MAX}$ is preset such that the maximum polishing time tmax corresponds to a polishing time that occurs between (i) a typical amount of polishing time needed to reach endpoint, and (ii) a typical mount of polishing time needed to damage the semiconductor wafer 100. Accordingly, the controller 250 may halt the polishing of the semiconductor wafer 100 after polishing the semiconductor for the maximum polishing time $t_{MAx}$ even though the controller 250 has not determined that the polishing has reached the polishing endpoint layer 112.

Figure 5:
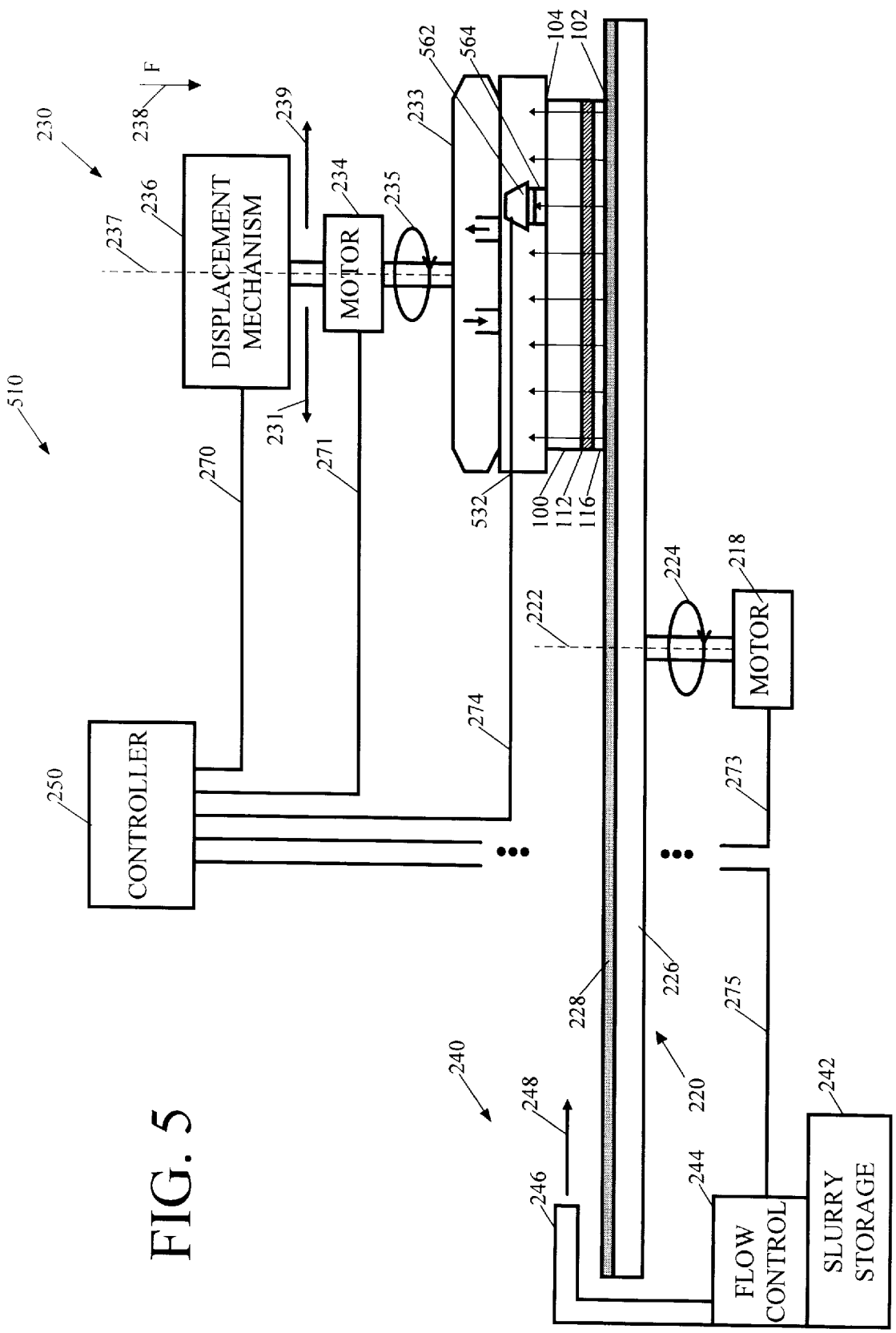
FIG. 5 shows a second embodiment of a polishing system which incorporates various features of the present invention therein.

Referring now to FIG. 5 in which like components of FIG. 2 are referenced with the like numerals, there is shown a preferred embodiment of a polishing system 510 for polishing a front surface 102 of the semiconductor wafer 100. The polishing system 510 is quite similar to the polishing system 210 of FIG. 2. The main differences are the location of the sensor 262 and the fact that the polishing system 510 does not include heating elements 260. In particular, the wafer carrier 532 includes an embedded sensor 562 that is operable to (i) receive thermal energy through a window or hole 564 in the wafer carrier 532, and (ii) generate a signal that is representative of the received thermal energy.

To this end in one embodiment, the sensor 562 includes an infrared detector such as an optical pyrometer that is focused to receive infrared signals generated by (i) friction produced due to the polishing process rubbing the front surface 102 of the semiconductor wafer 100 against the polishing pad 228, and (ii) the chemical slurry reacting with the front surface 102 of the semiconductor wafer 100. Moreover, in order to separate infrared signals generated by the chemical slurry from infrared signals generated by friction, the infrared detector of the sensor 562 may be tuned to receive frequency components of an infrared spectrum that are indicative of the chemical slurry reacting with the front surface 102 of the semiconductor wafer 100.

In operation, the polishing system 510 polishes a front surface 102 of a semiconductor wafer 100 in order to planarize the front surface 102 of the semiconductor wafer 100. In particular, the polishing system 210 removes material from the front surface 102 until the polishing endpoint layer 112 is reached. To this end, the wafer carrier 532 engages the back surface 104 of a semiconductor wafer 100 and presses the front surface 102 of the semiconductor wafer 100 against the polishing pad 228 with a force F. The controller 250 causes (i) the platen motor 218 to rotate the platen subassembly 220 at a platen velocity $V_P$, (ii) the carrier motor 234 to rotate the wafer carrier 232 at a wafer velocity of $V_W$, (iii) the displacement mechanism 236 to execute a polishing path P, and (iv) the flow control mechanism 244 to apply chemical slurry to the polishing pad 228 at a flow rate of $\Phi_s$. The resulting complex movement of the wafer carrier 532 relative to the polishing pad 228, the force F, and the chemical slurry all cooperate to remove material from the front surface 102 of the semiconductor wafer 100 and to reduce the thickness T of the semiconductor wafer 100.

Moreover, the rubbing of the front surface 102 of the semiconductor 100 and the chemical slurry reacting with the material of the front surface 102 generates heat that radiates an infrared spectrum through the front surface 102 and the semiconductor wafer 100 to the back surface 104. The sensor 562 receives the infrared spectrum from the back surface 104 and generates an electrical signal that is representative of the received infrared spectrum. The controller 250 processes the electrical signal generated by the sensor 562 and determines from the processed electrical signal whether the semiconductor wafer 100 has reached the polishing endpoint layer 112. In response to determining that the polishing process reaching the polishing endpoint layer 112, the controller 250 halts the polishing process.

Figure 6:
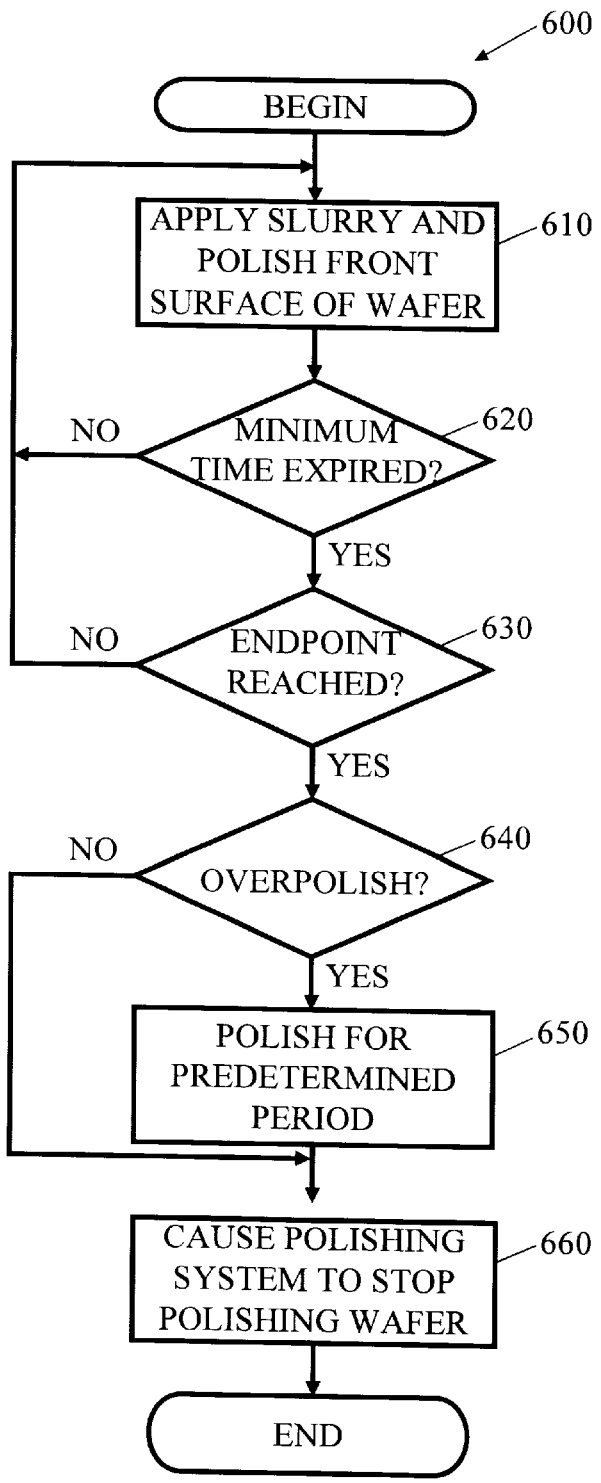
FIG. 6 shows a flowchart of a polishing procedure used by the polishing system of FIG. 5.

FIG. 6 illustrates a polishing procedure 600 utilized by the polishing system 510. The controller 250 in step 610 of the polishing procedure 600 causes the polishing system 210 to begin polishing the front surface 102 of the semiconductor wafer 100 in order to planarize the semiconductor wafer 100. In particular, the controller 250 causes the polishing system 510 to (i) apply chemical slurry to the polishing pad 228 and (ii) rub the front surface 102 of the semiconductor wafer 100 against the slurry covered polishing pad 228. The rubbing of the front surface 102 generates heat due to friction and the chemical slurry reacting with materials of the semiconductor wafer 100.

The chemical slurry used by the polishing system 510 is selected to react with the metal layer 116 at a first reaction rate that is different than a second reaction rate which the chemical slurry reacts with the polishing endpoint layer 112. In particular, the chemical slurry in a preferred embodiment contains reactants that react with the metal layer 116 at a higher reaction rate than the reactants react with the polishing endpoint layer 112. As a result, the chemical slurry generates more heat and an infrared spectrum with a greater intensity level when the polishing system 510 is polishing the polishing endpoint layer 112 than when the polishing system 510 is polishing the polishing endpoint layer 112. The generated infrared spectrum passes through the metal layer 116 and the polishing endpoint layer 112 and is received by the sensor 562.

As the infrared spectrum passes through the metal layer 116, the metal layer 116 reduces the intensity of the infrared spectrum based upon the emissivity of the metal layer 116. Similarly, as the infrared spectrum passes through the polishing endpoint layer 112, the polishing endpoint layer 112 reduces the intensity of the infrared spectrum based upon the emissivity of the polishing endpoint layer 112. Accordingly, the semiconductor wafer 100 functions as a thermal resistor which reduces the intensity of the infrared spectrum as the infrared spectrum passes through the semiconductor wafer 100.

In particular, the thermal resistance of the semiconductor wafer 100 decreases as the polishing system 210 decreases the thickness T of the semiconductor wafer 100. The polishing system 210 generally removes material from the front surface 102 of the semiconductor wafer 100 at a substantially linear polishing rate. As a result, the thermal resistance of the semiconductor wafer 100 decreases at a substantially linear rate which causes the intensity of the infrared spectrum to increase at a substantially linear rate until the polishing system reaches the polishing endpoint layer 112.

Figure 7:
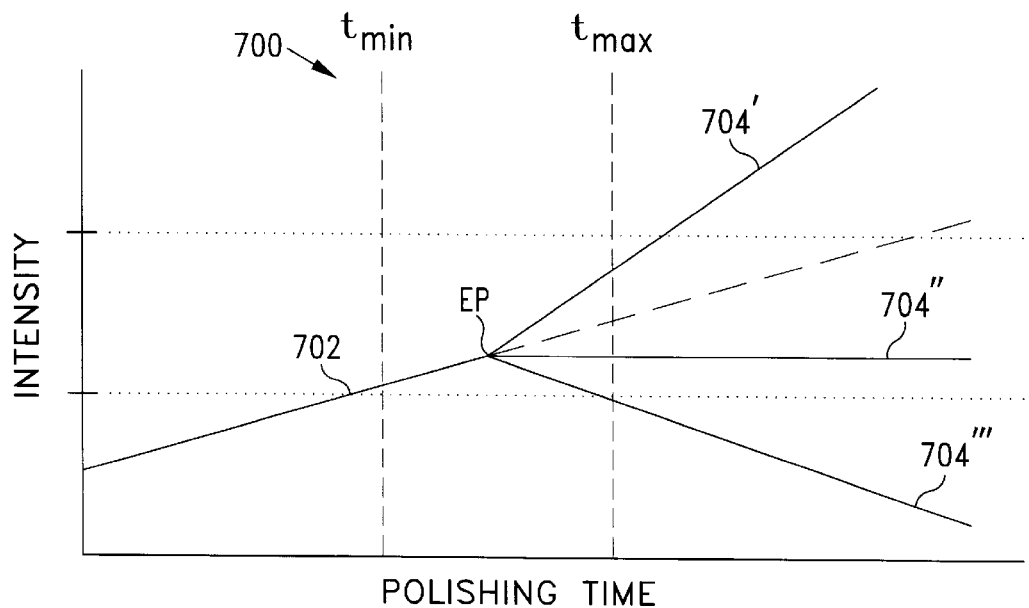
FIG. 7 shows an intensity level response of an infrared spectrum received from the front surface of the semiconductor during the polishing procedure of FIG. 6.

The increase in the intensity level of the infrared spectrum as the polishing system 510 removes material from the semiconductor wafer 100 is illustrated in FIG. 7 by the portion 702 of the curve 700. As depicted in FIG. 7, the intensity of the infrared spectrum increases over time as the polishing system 510 decreases the thickness T of the semiconductor wafer 100.

In step 620, the controller 250 determines whether the polishing system 510 has polished the semiconductor wafer 100 for at least a predetermined minimum polishing time $t_{MIN}$. If the controller 250 determines that the polishing system 510 has not polished the semiconductor wafer 100 for the predetermined minimum polishing time $t_{MIN}$, then the controller returns to step 610 in order for the polishing system 510 to further remove material from the front surface 102 of the semiconductor wafer 100. The predetermined minimum polishing time $t_{MIN}$ is set to a time less than the time needed to polish the front surface 102 down to the polishing endpoint layer 112.

In step 630, the controller 250 determines whether the polishing system 510 has polished the front surface 102 down to the polishing endpoint layer 112. To this end, the sensor 562 generates an electrical signal that is indicative of the infrared spectrum received from the back surface 104 of the semiconductor wafer 100. The controller 250 receives the electrical signal from the sensor 562 and determines from the electrical signal whether the polishing system 210 has reached the polishing endpoint layer 112. Since the polishing system 210 utilizes a chemical slurry that reacts with the material of the metal layer 116 at a first reaction rate that is different than a second reaction which the chemical slurry reacts with the material of the polishing endpoint layer 112, the chemical slurry generates a different infrared spectrum once the chemical slurry comes in contact with the polishing endpoint layer 112.

Moreover, once the polishing system 510 reaches the polishing endpoint layer 112, the infrared spectrum no longer passes through the metal layer 116. Accordingly, a larger portion of the infrared spectrum passes through the semiconductor wafer 100. If the chemical slurry used by the polishing system 510 reacts less readily with the polishing endpoint layer 112 than it reacts with the metal layer 116, then the portion of the infrared spectrum due to the chemical slurry reacting with semiconductor exhibits a decrease in intensity when the polishing system 510 reaches the polishing endpoint layer 112. The decrease in intensity of the infrared spectrum is illustrated by portion 704''' of the curve 700. On the other hand, if the chemical slurry used by the polishing system 510 reacts with the polishing endpoint layer 112 at a higher reaction rate than the chemical slurry reacts with the metal layer 116, then the portion of the infrared spectrum due to the chemical slurry reacting with the semiconductor wafer 100 exhibits an increase in intensity when the polishing system 510 reaches the polishing endpoint layer 112. The increase in intensity of the infrared spectrum is illustrated by portion 704''' of the curve 700.

Since the infrared spectrum exhibits the characteristics shown in FIG. 7, the controller 250 may determine that the polishing system 210 has reached the is polishing endpoint layer 112 based upon the electrical signal produced by the sensor 562. In particular, if the polishing system 210 is configured to remove the polishing endpoint layer 112 at a polishing rate substantially less than the polishing rate of the metal layer 116, the controller 250 may detect that the polishing system 210 has reached the polishing endpoint layer 210 by determining that the infrared spectrum has reached a substantially constant intensity level (i.e. a rate of change substantially equal to zero) in relation to intensity level change experienced during polishing the metal layer 116. (See portion 704''' of curve 700 in FIG. 7.)

Alternatively, the controller 250 may detect that the polishing system 210 has reached the polishing endpoint layer 112 by (i) determining that the intensity level over time has changed by less a predetermined amount, (ii) determining that the rate of change of the intensity level equals a predetermined rate of change value, or (iii) determining that the rate of change of the intensity level changed from a first predetermined rate to a second predetermined rate. (See portions 704', 704'', and 704''' of curve 700 in FIG. 7.)

Moreover, the controller 250 may also detect that the polishing system 510 has reached the polishing endpoint layer 210 by monitoring a predetermined frequency component or components of the infrared spectrum. The predetermined frequency components of the infrared spectrum are selected based upon being indicative of the chemical slurry reacting with the metal layer 116 and may be obtained by experimentation. For example, the predetermined frequency components may be obtained by polishing a test semiconductor wafer down to the polishing endpoint layer 112 using known polishing techniques and obtaining infrared spectrum data during the polishing process. After polishing the test semiconductor wafer, the infrared spectrum data may be analyzed to obtain frequency components of the infrared spectrum which are indicative of the chemical slurry reacting with the test semiconductor wafer.

The controller 250 may detect that the polishing endpoint layer 112 has been reached by determining whether the predetermined frequency components have a predetermined relationship to a predetermined value. To this end, the controller 250 includes a Fast Fourier Transform (FFT) processor which receives the electrical signal from the sensor 562 and extracts frequency components of the infrared spectrum. The controller 250 then may determine that the polishing endpoint has been reached, if the predetermined frequency components are not present or are not present at a sufficient enough level.

If the controller 250 determines in step 630 that the polishing system 510 has reached the polishing endpoint layer 112, the polishing system 510 proceeds to step 640; otherwise, the polishing system 510 returns to step 610 in order to remove more material from the semiconductor wafer 100 and reduce the thermal resistance of the semiconductor wafer 100.

In step 640, the controller 250 determines whether the polishing system 210 has been configured to overpolish the semiconductor wafer 100. After some fabrication processes it is desirable to polish the semiconductor wafer beyond the detected endpoint. Accordingly, if the controller 250 has determined that the polishing system 510 has been configured to overpolish the semiconductor wafer 100, the polishing system 510 proceeds to step 650; otherwise the polishing system 510 proceeds to step 660.

In step 650, the controller 250 causes the polishing system 510 to further polish the front surface 102 of the semiconductor wafer 100 for a predetermined period of time. Once the predetermined period of time has elapsed, the controller proceeds to step 660.

The controller 250 in step 660 causes the polishing system 510 to stop polishing the semiconductor wafer 100. In particular, the controller 250 transmits control signals to the various components of the polishing system 510 which cause the polishing system 510 to cease removal of material from the front surface 102 of the semiconductor wafer 100.

While the invention has been illustrated and described in detail in the drawings and foregoing description, such illustration and description is to be considered as exemplary and not restrictive in character, it being understood that only preferred embodiments have been shown and described and that all changes and modifications that come within the spirit of the invention are desired to be protected. For example, while the invention has been described as polishing a metal layer down to a polishing endpoint layer, the present invention may also be used to polish different materials down to the polishing endpoint layer. Moreover, the polishing endpoint layer need not be a separate layer, but may simply be material under the layer to be polished away which is different than the material of the layer to be polished away.

What is claimed is:

1. A method of polishing a first layer of a semiconductor wafer down to a second layer of said semiconductor wafer, comprising the steps of:

heating a back surface of said semiconductor wafer to a first temperature level so as to cause a front surface of said semiconductor wafer to have a second temperature level;

polishing said semiconductor wafer whereby material of said first layer is removed from said semiconductor wafer, said polishing step causing said second temperature level of said front surface to change at a first rate as said material of said first layer is being removed; and halting said polishing step in response to said second temperature level of said front surface changing at a second rate that is indicative of said second layer being polished during said polishing step.

2. The method of claim 1, wherein said halting step includes the steps of:

determining that said second temperature level is changing at said second rate, waiting a period after said determining step determines that said second temperature is changing at said second rate, and halting said polishing step after said period has lapsed.

3. The method of claim 1, wherein said heating step causes infrared signals to be emitted from said front surface, further comprising the step of:

determining said second temperature level from said infrared signals.

4. The method of claim 1, wherein said halting step includes the steps of:

generating a temperature signal that is representative of said second temperature level of said front surface, said temperature signal being generated by a thermocouple which is positioned in thermal communication with said front surface, and determining from said temperature signal that said second temperature level of said front surface is changing at said second rate.

5. The method of claim 1, wherein said halting step includes the steps of:

monitoring said second temperature level of said front surface to determine when said second rate is substantially equal to zero, and halting said polishing step in response to said monitoring step determining when said second rate is substantially equal to zero.

6. The method of claim 1, wherein said halting step includes the steps of:

monitoring said second temperature level of said front surface to determine when said second temperature level has changed by less than an amount over a period, and halting said polishing step in response to said monitoring step determining when said second temperature level has changed by less than a amount over said period.

7. The method of claim 1, wherein:

said polishing step includes the step of polishing said semiconductor wafer for a minimum polishing period, and said halting step includes the steps of (i) determining that said second temperature level is changing at said second rate, and (ii) initiating said determining step in response to said minimum polishing period lapsing.

8. The method claim 1, wherein:

said polishing step comprises the step of urging said wafer carrier against said back surface of said semiconductor wafer so as to cause said front surface of said semiconductor wafer to be pressed against a polishing surface so that said material of said first layer is removed from said semiconductor wafer during rotation of said polishing surface, and said heating step comprises the step of exciting heating elements of said wafer carrier to heat said back surface of said semiconductor wafer during said urging step.

9. A method of polishing a first layer of a semiconductor wafer down to a second layer of said semiconductor wafer, comprising the steps of:

heating said semiconductor wafer to a temperature level;

polishing said semiconductor wafer during said heating step;

detecting when a rate of change of said temperature level changes from a first rate to a second rate during said polishing step and generating a control signal in response thereto; and halting said polishing step in response to generation of said control signal.

10. A method of polishing a first layer of a semiconductor wafer down to a second layer of said semiconductor wafer, comprising the steps of:

heating said semiconductor wafer to a temperature level;

polishing said semiconductor wafer during said heating step;

determining a rate of change of said temperature level during said polishing step; and halting said polishing step when said rate of change equals a rate of change value.

* * * * *